United States Patent
Sosnowski (10) Patent No.: US 6,201,182 B1
(45) Date of Patent: *Mar. 13, 2001

(54) MOUNTING SYSTEM AND METHOD FOR MOUNTING TRACK HAVING BARBED RIVETS

(75) Inventor: Anthony Michael Sosnowski, Stroudsburg, PA (US)

(73) Assignee: Instrument Specialties Company, Delaware Water Gap, PA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/139,654
(22) Filed: Aug. 25, 1998

(51) Int. Cl.⁷ .................................................. H01K 9/00
(52) U.S. Cl. .................... 174/35 GC; 361/816; 361/818; 277/653; 277/970
(58) Field of Search ............... 174/35 GC, 35 R; 361/816, 818; 277/920, 653; 439/927

(56) References Cited

U.S. PATENT DOCUMENTS

| | | | |
|---|---|---|---|
| 3,140,342 | * 7/1964 | Ehrreich et al. | 174/35 |
| 3,752,899 | * 8/1973 | Bakker | 174/35 GC |
| 4,594,472 | * 6/1986 | Brettle et al. | 174/35 GC |
| 4,822,060 | * 4/1989 | Moyer et al. | 277/166 |
| 5,231,246 | * 7/1993 | Benson et al. | 174/35 R |
| 5,386,345 | * 1/1995 | Matsuzaki et al. | 361/816 |
| 5,488,766 | * 2/1996 | Gerry et al. | 29/600 |
| 5,603,514 | * 2/1997 | Jencks et al. | 277/230 |

* cited by examiner

Primary Examiner—Kristine Kincaid
Assistant Examiner—W. David Walkenhorst
(74) Attorney, Agent, or Firm—Burns, Doane, Swecker & Mathis, L.L.P.

(57) ABSTRACT

A mounting system includes a wall having at least one hole formed therein, and a track having at least one barb extending from a first surface of the track, the track having a second surface on an opposite side of the track from the first surface. The at least one barb is wider than the at least one hole and is sufficiently resiliently compressible to be passed through the at least one hole in one direction and expand to prevent removal of the barb in a second direction, thereby securing the track relative to the wall.

24 Claims, 5 Drawing Sheets

MOUNTING SYSTEM AND METHOD FOR MOUNTING TRACK HAVING BARBED RIVETS

FIELD OF THE INVENTION

The present invention relates to a mounting track and, more particularly, to a mounting track having barbs for attachment to an object, a mounting system, and a method for attachment of a mounting track.

BACKGROUND AND SUMMARY OF THE INVENTION

As is well known, selected electric or electronic parts radiate electromagnetic waves which can cause noise or unwanted signals to appear in electric or electronic parts and devices existing in the vicinity of the radiating parts. Accordingly, it is highly desirable to provide shielding and/or grounding for electronic components that use circuitry that emits or is susceptible to electromagnetic radiation. It is known that these components can be shielded to reduce undesirable electromagnetic interference and/or susceptibility effects with the use of a conductive shield that reflects or dissipates the electromagnetic charges and fields. Such shielding may be grounded to allow the offending electrical charges and fields to be dissipated without disrupting the operation of the electronic components enclosed within the shield.

Various types of EMI/RFI shielding devices are known for reducing the transmission of EMI and RFI. Among the known devices are gaskets or strips of a resiliently deformable material which are secured to an openable access panel, door, drawer, or the like (hereinafter "door"), to block the transmission of EMI/RFI through the small clearance between the door and the adjacent structure which forms the opening into and out of which the door is movable. Such strips are useful for shielding openings of housings for electronic components which are highly sensitive to the adverse effects of EMI/RFI.

Such known devices are typically made of one of several materials which have the combined functions of acting as an EMI/RFI shield, and which are resiliently deformable so that they can be compressed between the door when closed, and will spring back to an uncompressed configuration when the door is moved out of the opening. The applicant's U.S. Pat. No. 5,889,229, issued on Mar. 30, 1999, which is hereby incorporated by reference, provides examples of such gaskets.

Prior shielding strips, although providing an adequate level of shielding for the electronic devices, are often difficult to install on an electronics housing and are often not secured to a mounting surface to withstand the forces generated in use without detaching from the surface. For example, one prior strip utilizes a track which is riveted to the mounting surface of the housing, the shielding strip then being slid onto the riveted track to hold the strip in place. Although providing a secure mount for the shielding strip, the riveted track involves a relatively complicated installation procedure, involving several steps, and is therefore labor intensive. Furthermore, a shielding strip which requires a riveted track is relatively expensive, because it requires extra parts (a track and rivets), and added labor to install. The riveted track is also somewhat prone to misinstallation, because installation requires alignment of a rivet with holes in the track.

It is desirable to provide a mounting system and method for mounting shielding strips that is inexpensive and simple to install.

According to an embodiment of the present invention, a mounting system includes a wall having at least one hole formed therein, and a track having at least one barb extending from a first surface of the track, the track having a second surface on an opposite side of the track from the first surface. The at least one barb is wider than the at least one hole and is sufficiently resiliently compressible to be passed through the at least one hole in one direction and expand to prevent removal of the barb in a second direction, thereby securing the track relative to the wall.

According to another embodiment of the present invention, a mounting track is provided. The mounting track includes a first surface, at least one barb extending from the first surface of the track, the at least one barb having a first end distal from the first surface of the track, the first end being, in an expanded state, wider than at a second end of the barb at the first surface of the track, the first end of the barb being resiliently compressible to a width narrower than the expanded state, and a second surface on an opposite side of the track from the first surface.

According to still another embodiment of the present invention, a method is provided for mounting a mounting track to a wall, the track having at least one barb extending from a first surface of the track, the at least one barb having a first end distal from the first surface of the track, the first end being, in an expanded state, wider than at a second end of the at least one barb at the first surface of the track, the first end of the at least one barb being resiliently compressible to a width narrower than the expanded state, the wall having a hole narrower than the expanded state of the at least one barb formed therein and at least as large as a compressed width of the at least one barb. According to the method, the first end of the at least one barb is compressed. The first end of the at least one barb is extended through the hole in the wall. The track is secured to the wall by permitting the first end of the at least one barb to expand to its expanded state.

It will be appreciated that, although a preferred embodiment of the present invention is as a mounting system and method for mounting shielding strips, the present invention has numerous applications in other fields where it is desirable to mount items relative to one another.

BRIEF DESCRIPTION OF THE DRAWINGS

The features and advantages of the present invention are well understood by reading the following detailed description in conjunction with the drawings in which like numerals indicate similar elements and in which.

DETAILED DESCRIPTION

Figures 1, 2A, 2B:
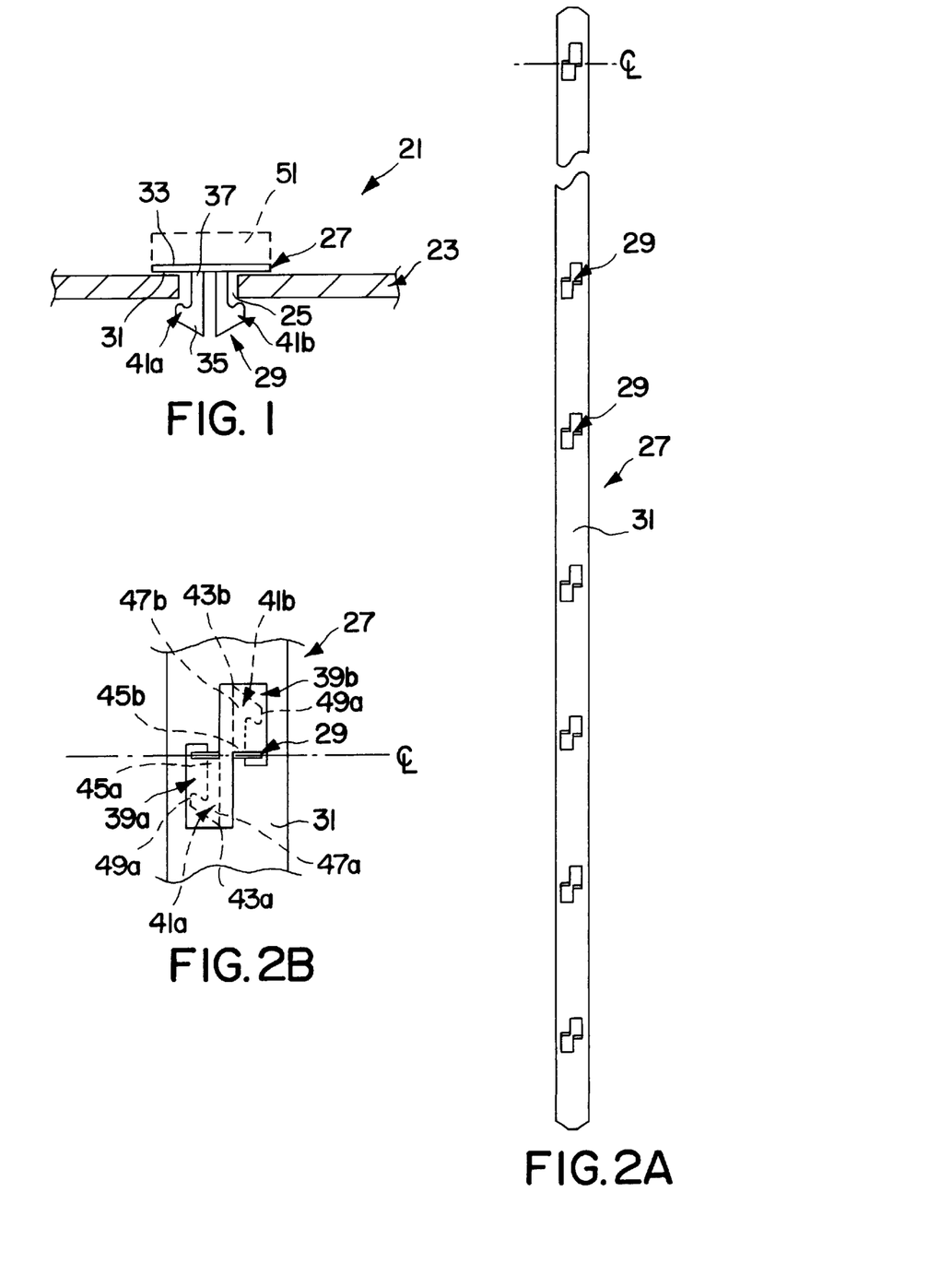
FIG. 1 is a partially cross-sectional view of a mounting system according to an embodiment of the present invention.
FIGS. 2A and 2B show steps in a process for forming a barbed mounting track according to an embodiment of the present invention.

A mounting system 21 according to an embodiment of the present invention is seen in cross-section in FIG. 1. The mounting system 21 preferably includes a wall 23 having at least one and preferably a plurality of holes 25 formed therein. The wall 23 is a wall of any object to which it is desired to mount an object, such as the wall of an electrical enclosure to which it is desired to mount a shielding strip to shield and/or ground a door of the electrical enclosure.

The mounting system 21 further includes a track 27 having at least one and preferably, as seen in FIG. 2A, a plurality of barbs 29 extending from a first surface 31 of the track. The barbs 29 preferably correspond in number to and are receivable in corresponding ones of the holes 25. The track 27 is preferably a strip of stainless steel, or other suitable, preferably electrically conductive, material, sheet and has a second surface 33 on an opposite side of the track from the first surface 31.

Figure 3:
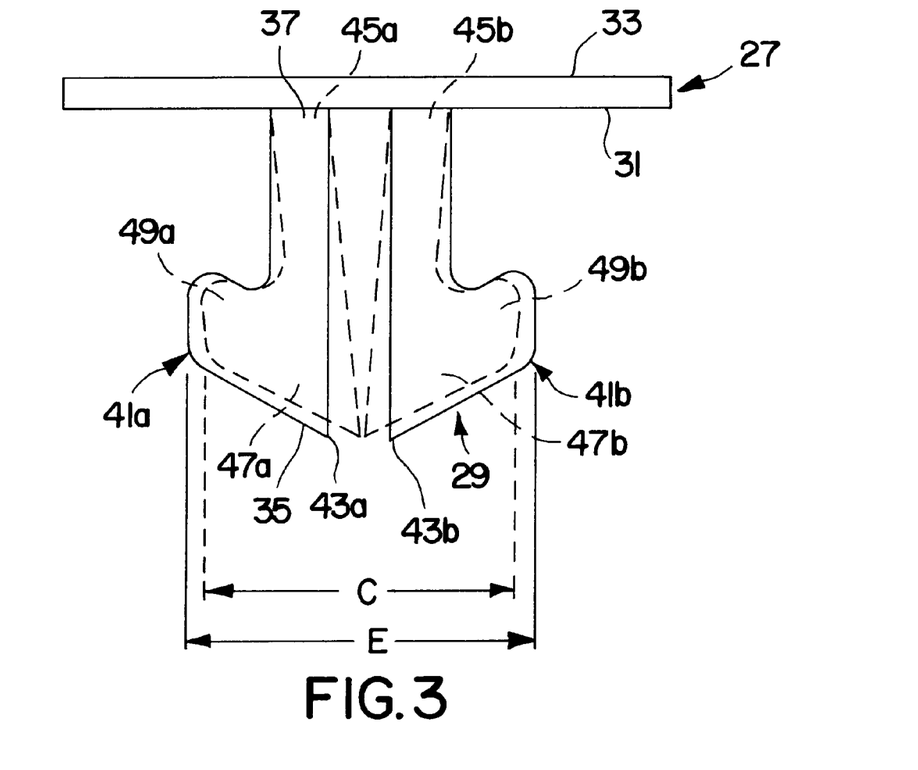
FIG. 3 is a side view of a barbed track according to an embodiment of the invention.

The barbs 29 each have a first end 35 distal from the first surface 31 of the track 27. The first end 35 of the barb is resiliently compressible and, in an expanded state E shown in FIG. 3, is wider than at a second end 37 of the barb at the first surface 31 of the track 27. The first end 35 of the barb 29 is resiliently compressible to a width C (shown in phantom) narrower than the expanded state. Preferably, the first end 35 of the barb 29 is wider than the hole 25 in which it is receivable when the first end of the barb is in an expanded state E and is compressible to a width C narrower than the hole in order to be inserted into the hole.

When the first end 35 of the barb 29 is compressed from the expanded state E to the compressed width C and passed in a first direction through a hole 25, the first end of the barb is then permitted to expand to the expanded state E to prevent removal of the barb in a second direction, thereby securing the track 27 relative to the wall 23. The length of the barb 29 is at least as long as the wall 23 is thick so that, when the barb 29 is inserted in the hole 25, the first end 35 of the barb extends completely through the wall for securing the track 27 to the wall.

As noted, the track 27 is preferably formed from a stainless steel sheet, but may be formed from any suitable, preferably flexible, preferably sheet-like material. As seen with reference to FIG. 2B, the barbs 29 are preferably formed integrally with the track 27, such as by cutting or stamping opposing, tongued openings 39a and 39b in the track. The tongued openings 39a and 39b preferably have tongues 41a and 41b, respectively, each tongue having the shape of half of the barb 29. Each tongue 41a and 41b is preferably "L" shaped, and preferably forms a point 43a and 43b at a corner of the "L".

Ends 45a and 45b of the tongues 41a and 41b, respectively, are disposed at a distance from each other along a substantially common centerline such that, as seen in FIGS. 1 and 3, when the tongues 41a and 41b are bent relative to the track 27 at their ends 45a and 45b on this line, they form the barb 29. By spacing the ends 45a and 45b of the tongues 41a and 41b at a distance from each other, the resulting barb 29 is made compressible because the distal ends 47a and 47b of the tongues 41a and 41b can be compressed from the expanded state toward each other across the space to a compressed width, shown in phantom in FIG. 3. In the compressed width, the barb 29 is preferably capable of being inserted through a hole 25 in the wall 23 and, in the expanded state, is preferably prevented from being withdrawn from the hole by legs 49a and 49b of the "L" shaped tongues 41a and 41b.

The mounting system 21 preferably includes a material 51 (shown in phantom in FIG. 1), preferably an electrical shielding and/or gasket material, secured to the track 27. The material 51 may be secured to the first and/or second surface 31 and/or 33 of the track 27 in any suitable way, such as by an adhesive or tape, by barbs, such as by barbs 29, or by other mechanical fastening techniques. According to certain preferred embodiments, the material 51 is secured to the second surface 33 of the track 27 by adhesive or to the first surface 31 of the track by barbs 29. The nature and shape of the material 51 is expected to affect what the best attachment technique is.

Where, according to a preferred embodiment, the material 51 is an electrical shielding and/or gasket material, particular forms of material are presently preferred. Preferred shielding gaskets include the type disclosed in applicant's U.S. Pat. No. 5,889,229, issued on Mar. 30, 1999, which is hereby incorporated by reference. Several of the presently preferred materials will now be discussed.

Figure 4A:
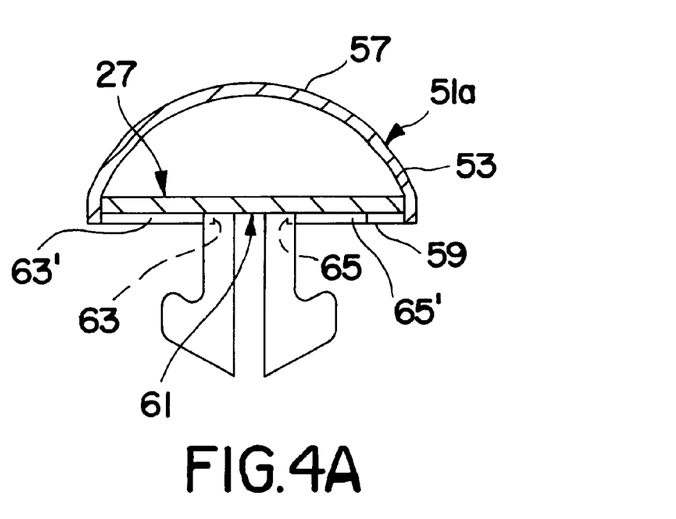
FIG. 4A is a partially cross-sectional view of a mounting track according to a first embodiment of the present invention and FIG. 4B is a plan view of a gasket material prior to being bent to form part of the mounting track of FIGS. 4A or 5 according to an embodiment of the invention.

One presently preferred material 51a seen in FIG. 4A is formed from a strip 53 of material (shown in FIG. 4B in an unformed condition) that is provided with a series of parallel slots 55 extending perpendicular to the longitudinal axis of the strip. The strip is preferably formed from a beryllium copper alloy. A more preferable beryllium copper alloy is composed of between about 1.8% (weight) and about 2.0% (weight) beryllium, a maximum of about 0.6% (weight) of the combination of cobalt, nickel, and iron, and the balance copper, which alloy has an electrical conductivity of between about 22% and about 28% IACS (International Annealed Copper Standard). One suitable alloy is available from Brush Wellman, Cleveland, Ohio, as Brush Alloy 25 (copper alloy UNS number C17200). Other suitable materials include phosphor bronze, copper-clad steel, brass, monel, aluminum, steel, stainless steel, nickel silver, and other BeCu alloys. Furthermore, the material can optionally be pre- or post-plated for galvanic compatibility with the surface on which it is intended to be mounted. Alternatively, the material can be a molded or cast polymer, preferably loaded or coated to be electrically conductive.

Figure 4B:
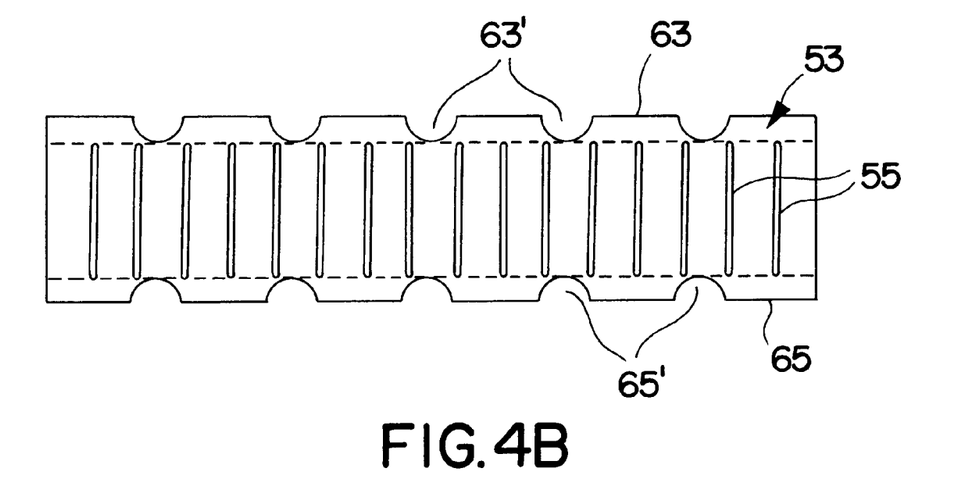
Figure 5:
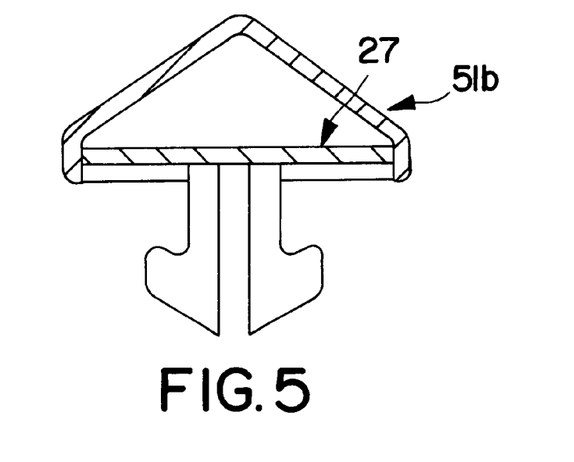
FIG. 5 is a perspective view of a mounting track according to a second embodiment of the present invention.

The strip 53 is bent along its longitudinal axis to define a curved portion 57 across which the slots 55 extend, the curved portion being at least as wide as the slots 55 are long, and a flat portion 59 having a longitudinal slot 61 defined by longitudinal edges 63 and 65 of the strip 53. The longitudinal edges 63 and 65 may be provided with cut-outs 63' and 65' through which the barbs 29 can conveniently extend. The material 51a may be secured to the track 27 by being bent into shape around the track 27 or by being pre-bent such that the material 51a can be slid over the track with the barbs 29 protruding through the slot 61 or cut-outs 63' and 65'. The slots 55 facilitate bending of the material 51a. Another embodiment of the material is shown in FIG. 5, wherein, instead of being bent to form a rounded shape, the strip 53a is bent to form a material 51b having a more triangular shape.

Figure 6:
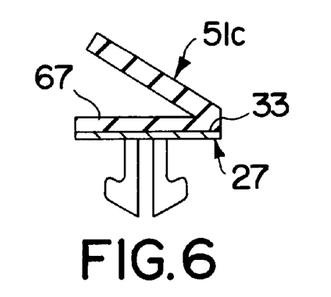
FIG. 6 is a partially cross-sectional view of a mounting track according to a third embodiment of the present invention.
Figure 7:
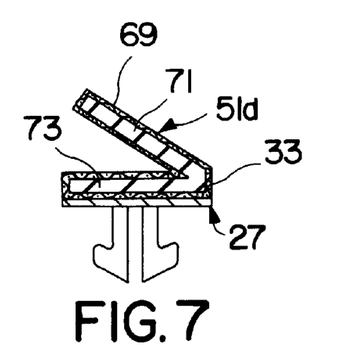
FIG. 7 is a partially cross-sectional view of a mounting track according to a fourth embodiment of the present invention.

According to other embodiments, the material 51 is a rubberized material, preferably an extruded material of a type suitable for electrical shielding and/or grounding purposes such as an electrically conductive elastomer, or an electrically conductive fabric sheath. Except where otherwise noted, the term "shielding" as used herein is meant to encompass shielding and/or grounding. The material 51 may, however, be non-conductive, if desired or necessary. The material 51 may take various suitable forms. FIG. 6 shows a rubber gasket material 51c that is in the form of a "V" or "C", with one leg 67 of the "V" or "C" being secured to the second surface 33 of the track 27, preferably by an adhesive. FIG. 7 shows a material 51d, similar to the material 51c except that it further includes a metallic sheath 69, preferably a knit or woven mesh sheath or a sheath formed from metallic yarns, around the rubber gasket material 71. One leg 73 of the "V" or "C" is secured to the second surface 33 of the track 27, preferably by an adhesive.

Figure 8:
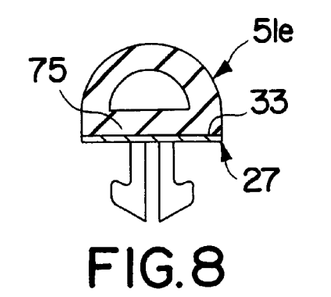
FIG. 8 is a partially cross-sectional view of a mounting track according to a fifth embodiment of the present invention.
Figure 9:
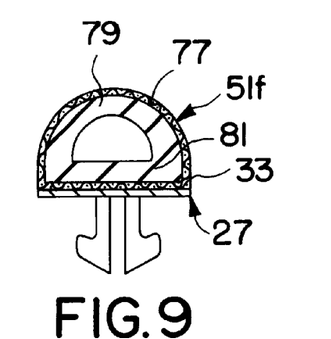
FIG. 9 is a partially cross-sectional view of a mounting track according to a sixth embodiment of the present invention.

FIG. 8 shows a rubber gasket material 51e that is "D" shaped. The flat part 75 of the "D" is preferably secured to the second surface 33 of the track 27 by an adhesive. FIG. 9 shows a material 51f, similar to the material 51e, except that it further includes a woven metallic mesh sheath 77 around the rubber gasket material 79. The flat side 81 of the "D" is preferably secured to the second surface 33 of the track 27 by an adhesive.

Figure 10:
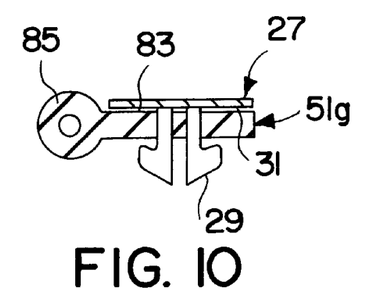
FIG. 10 is a partially cross-sectional view of a mounting track according to a seventh embodiment of the present invention.
Figure 11:
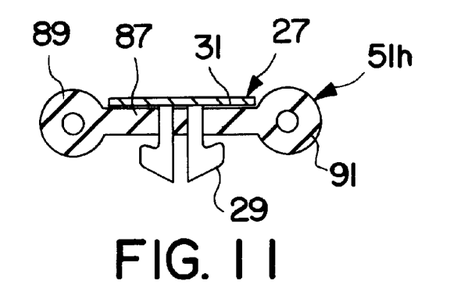
FIG. 11 is a partially cross-sectional view of a mounting track according to a eighth embodiment of the present invention.

FIG. 10 shows a material 51g that is preferably a rubberized gasket material having a flat portion 83 and a circular portion 85 at a longitudinal edge of the flat portion. The material 51g is preferably secured to the first surface 31 of the track 27 by the barbs 29 being extended through the flat portion 83 of the material such that the circular portion 85 is disposed along a longitudinal edge of the track. If desired or necessary, an adhesive may also be used to secure the material 51g to the track 27. FIG. 11 shows a material 51h that is preferably a rubberized gasket material having a flat portion 87 and circular portions 89 and 91 along each longitudinal edge of the flat portion. The material 51h is preferably secured to the first surface 31 of the track 27 by the barbs 29 being extended through the flat portion 87 such that the circular portions 89 and 91 are disposed along the longitudinal edges of the track.

Figure 12:
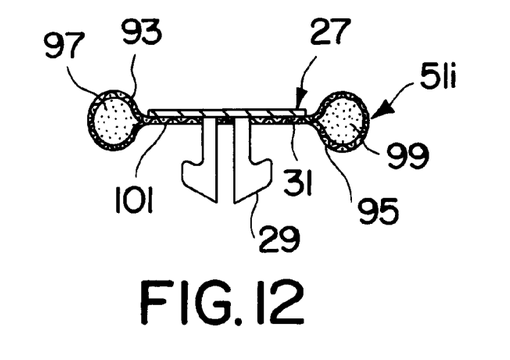
FIG. 12 is a partially cross-sectional view of a mounting track according to a ninth embodiment of the present invention.
Figure 13:
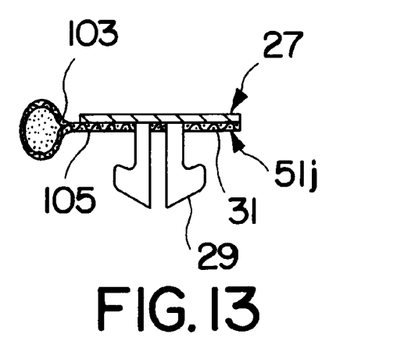
FIG. 13 is a partially cross-sectional view of a mounting track according to a tenth embodiment of the present invention.

FIG. 12 shows a material 51i that is preferably formed of a woven metallic mesh material such that longitudinal edges 93 and 95 of the material form loops around flexible, rope-like structures 97 and 99 also preferably made from the mesh material, the loops being connected by a web 101 of the mesh material through which the barbs 29 on the first surface 31 of the track 27 extend to secure the material 51i to the track. FIG. 13 shows material 51j similar to the material 51i that has only a single loop 103 and web 105. Instead of separate loops and rope-like structures, the embodiments of FIGS. 12 and 13 can be formed by rolling the edges of a mesh material into rope-like structures.

Figure 14:
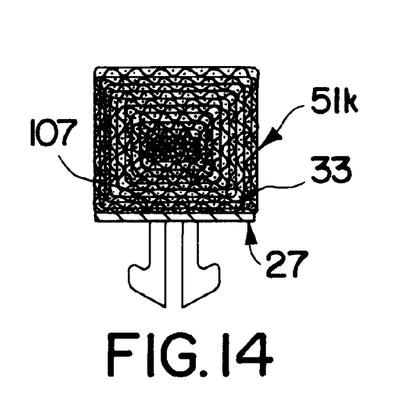
FIG. 14 is a partially cross-sectional view of a mounting track according to a eleventh embodiment of the present invention.

FIG. 14 shows an embodiment wherein the material 51k is preferably a rolled or otherwise shaped block of metallic mesh material that is preferably secured along a line or surface 107 to the second surface 33 of the track 27 by an adhesive. Instead of the square shape shown, the material 51k can be round or whatever other shape is desired or necessary. Instead of being formed of a metallic mesh, the material 51k may be formed of a suitable rubberized gasket material.

Figure 15:
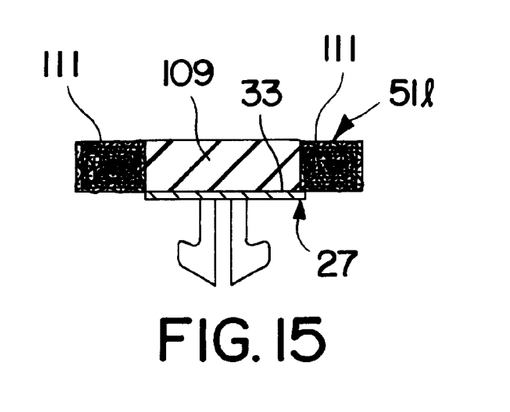
FIG. 15 is a partially cross-sectional view of a mounting track according to a twelfth embodiment of the present invention.

FIG. 15 shows an embodiment of a material 51l wherein a rubberized material 109, such as an extruded, rectangular shape, is combined with a metallic mesh material 111, such as the material 51i shown in FIG. 12. The rubberized material 109 may be secured to mesh of the material 111 by an adhesive or may be partially or completely wrapped by the mesh material, and the resulting structure 51l may be secured to the second surface 33 of the track 27, preferably by an adhesive. It will be appreciated that the foregoing shapes are merely representative of a number of different possible shapes for the material 51.

If desired or necessary, substantially any of the materials described above as preferably being secured to the second surface 33 of the track 27 by, for example, an adhesive could, alternatively, be secured to the first surface 31 of the track by, for example, the barbs 29 extending through the material and/or by an adhesive. Likewise, substantially any of the materials described above as preferably being secured to the first surface 31 of the track 27 by, for example, an adhesive and/or the barbs 29 could, alternatively, be secured to the second surface 33 by, for example, an adhesive.

Barbs 29 are preferably formed on the track 27 with predetermined spacing, preferably 1.5 inches (approx. 37 mm). A template having holes at similar spacing can be used for marking and forming holes 25 in the wall 23. A presently preferred size for the holes 25 is 0.125 inches (approx. 3 mm).

A preferred material for the track 27 is stainless steel, 0.015 inches thick by 0.319 inches wide (approx. 0.4 mm thick by approx. 8 mm wide), although other widths and thicknesses may be preferred for particular applications. Stainless steel is particularly preferred because the resulting track 27 has little or no effect on the shielding performance of the gasket material 51, and the stainless steel can provide improved galvanic compatibility with a wide range of mounting surfaces.

The mounting system 21 according to the present invention offers a variety of advantages. For example, the potential for misalignment that exists with conventional mounting systems having individual rivet mounting is reduced. Moreover, the mounting system is quite strong as compared to mounting systems that rely on pressure sensitive adhesives, which may be less well-suited to high temperature applications or applications where the mounting system will be subjected to shearing forces.

A method for mounting the mounting track 27 to a wall 23 according to the present invention is discussed with reference to FIGS. 1 and 3. The track has at least one barb 29 extending from the first surface 27 of the track. The barb 29 has a first end 35 distal from the first surface 31 of the track 27, the first end being, in an expanded state, wider than the second end 37 of the barb at the first surface of the track. As seen in FIG. 3. the first end 35 of the barb 29 is resiliently compressible to a width C (shown in phantom) narrower than the expanded state E. As seen in FIG. 1, the wall 23 has a hole 25 narrower than the expanded state of the barb 29. The hole 25 is at least as large as a compressed width of the barb 29.

The first end 35 of the barb 29 is compressed to the width C narrower than the expanded state E as well as narrower than the width of the hole 25. The first end 35 of the barb 29 is, in this compressed width, extended through the hole 25 in the wall 23. The track 27 is secured to the wall 23 by permitting the first end 35 of the barb 29 to expand to its expanded state as seen in FIG. 1.

A gasket material 51 is preferably secured to the track 27, preferably before the track 27 is secured to the wall 23. The gasket material 51 may be at least partially disposed between the track 27 and the wall 23, such as in the embodiments wherein the barbs 29 are caused to extend through the gasket material.

While this invention has been illustrated and described in accordance with a preferred embodiment, it is recognized that variations and changes may be made therein without departing from the invention as set forth in the claims.

What is claimed is:

1. A mounting system, comprising:
   a wall having at least one hole formed therein; and
   a track including a strip having a first substantially flat surface and a second substantially flat surface on an opposite side of the strip from the first surface, and at least one barb integral with and bent from the strip to extend from the first surface, the at least one barb having a first end distal from the first surface, the first end being, in an expanded state, wider than at a second end of the at least one barb at the first surface, the first end of the at least one barb being resiliently compressible to a width narrower than the expanded state, the at least one barb including at least two separate tongues, each tongue being formed from part of the strip, connected to the other tongue only by the strip, and having a substantially flat first and second surface, the first and second substantially flat surfaces of each tongue lying in a plane substantially perpendicular to a longitudinal direction of the strip, each tongue having a first portion extending substantially perpendicularly to the longitudinal direction of the strip and a second portion disposed at an end of the first portion distal from the first surface, the second portion extending substantially transverse to the longitudinal direction of the strip, wherein the at least one barb is wider than the at least one hole and is sufficiently resiliently compressible to be passed through the at least one hole in one direction and expand to prevent removal of the at least one barb in a second direction, thereby securing the track relative to the wall.

2. The mounting system as set forth in claim 1, further comprising a gasket material secured to the track.

3. The mounting system as set forth in claim 2, wherein the gasket material is secured to the second surface of the track.

4. The mounting system as set forth in claim 2, wherein the gasket material is secured to the track by the at least one barb extending through the gasket material.

5. The mounting system as set forth in claim 2, wherein the gasket material includes a slotted opening in which the track is received to secure the gasket material to the track and from which the at least one barb extends.

6. The mounting system as set forth in claim 2, wherein the gasket material provides electrical shielding.

7. The mounting system as set forth in claim 2, wherein the gasket material includes a metallic mesh.

8. The mounting system as set forth in claim 2, wherein the gasket material includes a rubber material.

9. The mounting system as set forth in claim 2, wherein the gasket material is an electrically conductive elastomer.

10. The mounting system as set forth in claim 1, wherein the first surfaces of each of the at least two tongues face in a direction parallel to the longitudinal direction of the strip, the first surface of a first one of the at least two tongues is continuous with the first surface of the strip, and the first surface of a second one of the at least two tongues is continuous with the second surface of the strip.

11. A mounting track, comprising:
    a strip having a first substantially flat surface and a second substantially flat surface on an opposite side of the strip from the first surface; and
    at least one barb integral with and bent from the strip to extend from the first surface, the at least one barb having a first end distal from the first surface, the first end being, in an expanded state, wider than at a second end of the at least one barb at the first surface, the first end of the at least one barb being resiliently compressible to a width narrower than the expanded state, the at least one barb including at least two separate tongues, each tongue being formed from part of the strip, connected to the other tongue only by the strip, and having a substantially flat first and second surface, the first and second substantially flat surfaces of each tongue lying in a plane substantially perpendicular to a longitudinal direction of the strip each tongue having a first portion extending substantially perpendicularly to the longitudinal direction of the strip and a second portion disposed at an end of the first portion distal from the first surface, the second portion extending substantially transverse to the longitudinal direction of the strip.

12. The mounting track as set forth in claim 11, further comprising a gasket material secured to the track.

13. The mounting track as set forth in claim 12, wherein the gasket material is secured to the second surface of the track.

14. The mounting track as set forth in claim 12, wherein the gasket material is secured to the track by the at least one barb extending through the gasket material.

15. The mounting track as set forth in claim 12, wherein the gasket material includes a slotted opening in which the track is received to secure the gasket material to the track and from which the at least one barb extends.

16. The mounting track as set forth in claim 12, wherein the gasket material provides electrical shielding.

17. The mounting track as set forth in claim 12, wherein the gasket material includes a metallic mesh.

18. The mounting track as set forth in claim 12, wherein the gasket material includes a rubber material.

19. The mounting track as set forth in claim 11, wherein the first surfaces of each of the at least two tongues face in a direction parallel to the longitudinal direction of the strip, the first surface of a first one of the at least two tongues is continuous with the first surface of the strip, and the first surface of a second one of the at least two tongues is continuous with the second surface of the strip.

20. A method for mounting a mounting track to a wall, comprising the steps of:

forming a track including a strip having a first substantially flat surface and a second substantially flat surface on an opposite side of the strip from the first surface, and at least one barb integral with and bent from the strip to extend from the first surface, the at least one barb having a first end distal from the first surface, the first end being, in an expanded state, wider than at a second end of the at least one barb at the first surface, the first end of the at least one barb being resiliently compressible to a width narrower than the expanded state, the at least one barb including at least two separate tongues, each tongue being formed from part of the strip, connected to the other tongue only by the strip, and having a substantially flat first and second surface, the first and second substantially flat surfaces of each tongue lying in a plane substantially perpendicular to a longitudinal direction of the strip, each tongue having a first portion extending substantially perpendicularly to the longitudinal direction of the strip and a second portion disposed at an end of the first portion distal from the first surface, the second portion extending substantially transverse to the longitudinal direction of the strip;

forming a hole in a wall, the hole being narrower than the expanded state of the at least one barb and at least as large as a compressed width of the at least one barb;

compressing the first end of the at least one barb;

extending the first end of the at least one barb through the hole in the wall; and securing the track to the wall by permitting the first end of the at least one barb to expand to its expanded state.

21. The method as set forth in claim 20, comprising the further step of securing a gasket material to the track.

22. The method as set forth in claim 21, wherein the gasket material is at least partially disposed between the track and the wall.

23. The method as set forth in claim 21, wherein the gasket material is at least partially secured to the track by forcing the at least one barb through the gasket material.

24. The method as set forth in claim 20, wherein the first surfaces of each of the at least two tongues face in a direction parallel to the longitudinal direction of the strip, the first surface of a first one of the at least two tongues is continuous with the first surface of the strip, and the first surface of a second one of the at least two tongues is continuous with the second surface of the strip.

* * * * *